United States Patent
Wang (10) Patent No.: US 10,770,353 B2
(45) Date of Patent: Sep. 8, 2020

(54) METHOD OF FORMING MULTI-THRESHOLD VOLTAGE DEVICES USING DIPOLE-HIGH DIELECTRIC CONSTANT COMBINATIONS AND DEVICES SO FORMED

(71) Applicant: Samsung Electronics Co., Ltd., Gyeonggi-do (KR)

(72) Inventor: Wei-E Wang, Austin, TX (US)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 15/898,421

(22) Filed: Feb. 16, 2018

(65) Prior Publication Data
US 2019/0148237 A1    May 16, 2019

Related U.S. Application Data

(60) Provisional application No. 62/587,327, filed on Nov. 16, 2017.

(51) Int. Cl.
*H01L 21/8234* (2006.01)
*H01L 21/28* (2006.01)
(Continued)

(52) U.S. Cl.
CPC ............ *H01L 21/823462* (2013.01); *H01L 21/28088* (2013.01); *H01L 21/82345* (2013.01);
(Continued)

(58) Field of Classification Search
CPC ......... H01L 21/82345; H01L 21/28088; H01L 29/4966; H01L 29/517; H01L 27/088
See application file for complete search history.

(56) References Cited

U.S. PATENT DOCUMENTS 7,718,496 B2    5/2010    Frank et al.
8,309,447 B2    11/2012    Cheng
(Continued)

OTHER PUBLICATIONS

J. Kavalieros et al., "Tri-Gate Transistor Architecture with High-k Gate Dielectrics, Metal Gates and Strain Engineering," VLSI 2006, pp. 50-51.
(Continued)

*Primary Examiner* — Christine A Enad
(74) *Attorney, Agent, or Firm* — Van Pelt, Yi & James LLP (57) ABSTRACT

A method provides a gate structure for a plurality of components of a semiconductor device. The method provides a first dipole combination on a first portion of the components. The first dipole combination includes a first dipole layer and a first high dielectric constant layer on the first dipole layer. A second dipole combination is provided on a second portion of the components. The second dipole combination includes a second dipole layer and a second high dielectric constant layer on the second dipole layer. The first dipole combination is different from the second dipole combination. At least one work function metal layer is provided on the first dipole combination and the second dipole combination. A low temperature anneal is performed after the step of providing the work function metal layer(s). A contact metal layer is formed on the work function metal layer.

15 Claims, 8 Drawing Sheets

(51) Int. Cl.
   *H01L 27/088* (2006.01)
   *H01L 29/51* (2006.01)
   *H01L 29/49* (2006.01)

(52) U.S. Cl.
   CPC ........ *H01L 27/088* (2013.01); *H01L 29/4966* (2013.01); *H01L 29/517* (2013.01)

(56) References Cited

U.S. PATENT DOCUMENTS

| | | |
|---|---|---|
| 8,530,974 B2 | 9/2013 | Cheng |
| 8,658,518 B1 | 2/2014 | Chang |
| 8,669,615 B1 | 3/2014 | Chang |
| 8,987,126 B2 | 3/2015 | Choi |
| 9,171,954 B2 | 10/2015 | Cartier |
| 9,245,982 B2 | 1/2016 | Wang |
| 9,337,109 B2 | 5/2016 | Doornbos |
| 9,362,180 B2 | 6/2016 | Lee |
| 9,418,899 B1 | 8/2016 | Shen |
| 9,455,201 B2 | 9/2016 | Joshi |
| 9,472,773 B1 | 10/2016 | Rosenblatt |
| 9,484,359 B2 | 11/2016 | Cheng |
| 9,613,870 B2 | 4/2017 | Ando |
| 9,728,462 B2 | 8/2017 | Fan |
| 9,748,354 B2 | 8/2017 | Tang |
| 2011/0227163 A1* | 9/2011 | Wang ............... H01L 21/82345 257/369 |
| 2012/0129330 A1* | 5/2012 | Kim ................. H01L 21/28176 438/591 |
| 2015/0021698 A1 | 1/2015 | Ando |
| 2015/0021699 A1 | 1/2015 | Ando |
| 2016/0093535 A1 | 3/2016 | Xu |
| 2017/0005175 A1 | 1/2017 | Song |
| 2017/0110324 A1* | 4/2017 | Tsai .................. C23C 16/45525 |
| 2019/0103414 A1* | 4/2019 | Ramkumar ......... H01L 29/4234 |

OTHER PUBLICATIONS

J.-P. Colinge, Ed., FinFETs and other multi-gate transistors. New York, NY: Springer, 2008, Part 1.

J.-P. Colinge, Ed., FinFETs and other multi-gate transistors. New York, NY: Springer, 2008, Part 2.

J.-P. Colinge, Ed., FinFETs and other multi-gate transistors. New York, NY: Springer, 2008, Part 3.

J.-P. Colinge, Ed., FinFETs and other multi-gate transistors. New York, NY: Springer, 2008, Part 4.

J.-P. Colinge, Ed., FinFETs and other multi-gate transistors. New York, NY: Springer, 2008, Part 5.

J.-P. Colinge, Ed. FinFETs and other multi-gate transistors. New York, NY: Springer, 2008, Part 6.

J.-P. Colinge, Ed., FinFETs and other multi-gate transistors. New York, NY: Springer, 2008, Part 7.

K.-M. Liu and C.-K. Lee, "Investigation of the random dopant fluctuations in 20-nm bulk mosfets and silicon-on-Insulator FinFETs by Ion implantation Monte Carlo simulation," Nanoelectronics Conference (INEC), 2013 IEEE 5th International 2013, pp. 263-266.

J. Xiang et al., "Investigation of TiAlC by Atomic Layer Deposition as N Type Work Function Metal for FinFET," ECS J. Solid State Sci. Technol., vol. 4, No. 12, pp. P441-P444, 2015.

Yee-Chia Yeo, P. Rariade, Qiang Lu, R. Lin, Tsu-Jae King, and Chenming Hu, "Effects of high-? dielectrics on the workfunctions of metal and silicon gates," IEEE Electron Device Lett, 2001, pp. 49-50.

R. Chau, S. Datta, M. Doczy, B. Doyle, J. Kavalieros, and M. Metz, "High-k/Metal-Gate Stack and Its MOSFET Characteristics," IEEE Electron Device Lett., vol. 25, No. 6, pp. 408-410, Jun. 2004.

M. Kadoshima et al., "Effective-Work-Function Control by Varying the TiN Thickness in Poly-Si/TiN Gate Electrodes for Scaled High-$k$ CMOSFETs," IEEE Electron Device Lett., vol. 30, No. 5, pp. 466-468, May 2009.

K. Choi et al., "The effect of metal thickness, overlayer and high-k surface treatment on the effective work function of metal electrode," Proceedings of ESSDERC 2005, pp. 101-104.

T. Nabatame, M. Kimura, H. Yamada, A. Ohi, T. Ohishi, and T. Chikyow, "(Invited) Mechanism of Vfb Shift in HfO2 Gate Stack by Al Diffusion from (TaC)1-xAlx Gate Electrode," ECS Trans., vol. 45, No. 3, pp. 49-59, Apr. 2012.

M. D. Giles et al., "High sigma measurement of random threshold voltage variation in 14nm Logic FinFET technology," Symposium on VLSI Technology 2015, pp. T150-T151.

C.-H. Yu, M.-H. Han, H.-W. Cheng, Z.-C. Su, Y. Li, and H. Watanabe, "Statistical simulation of metal-gate work-function fluctuation in high-k/metal-gate devices," SISPAD 2010, pp. 153-156.

A. R. Brown, N. M. Idris, J. R. Watling, and A. Asenov, "Impact of Metal Gate Granularity on Threshold Voltage Variability: A Full-Scale Three-Dimensional Statistical Simulation Study," IEEE Electron Device Lett., Nov. 2010.

T. Matsukawa et al., "Suppressing Vt and Gm variability of FinFETs using amorphous metal gates for 14 nm and beyond," IEDM Symposium 2012, p. 8.2.1-8.2.4.

A. Tarniowy, R. Mania, and M. Rekas, "The effect of thermal treatment on the structure, optical and electrical properties of amorphous titanium nitride thin films," Thin Solid Films, vol. 311, No. 1-2, pp. 93-100, Dec. 1997.

L.-A. Ragnarsson et al., "Zero-thickness multi work function solutions for N7 bulk FinFETs," VLSI 2016, pp. 1-2.

K. Kita, L. Q. Zhu, T. Nishimura, K. Nagashio, and A. Toriumi, "(Invited) Formation of Dipole Layers at Oxide Interfaces in High-k Gate Stacks," in ECS Transactions, 2010, vol. 33, pp. 463-477.

T. Ando et al., "Understanding mobility mechanisms in extremely scaled HfO2 (EOT 0.42 nm) using remote interfacial layer scavenging technique and Vt-tuning dipoles with gate-first process," presented at the IEDM, 2009, pp. 1-4.

S. Sioncke et al., "First demonstration of ~3500 cm 2 /V-s electron mobility and sufficient BTI reliability (max Vov up to 0.6V) In0.53Ga0.47As nFET using an IL/LaSiOx/HfO2 gate stack," VLSI 2017, pp. T38-T39.

H. Arimura et al., "Si-passivated Ge nMOS gate stack with low Dit and dipole-induced superior PBTI reliability using 3D-compatible ALD caps and high-pressure anneal," IEDM 2016, p. 33.4.1-33.4.4.

Q. Wang et al., "Influence of LaSiOx passivation interlayer on band alignment between PEALD-Al2O3 and 4H-SiC determined by X-ray photoelectron spectroscopy," Appl. Surf. Sci., vol. 428, pp. 1-6, Jan. 2018.

C. H. Lee et al., "Selective GeOx-scavenging from interfacial layer on Si1-xGex channel for high mobility Si/Si1-xGex CMOS application," VLSI 2016, pp. 1-2.

H. K. Liou, P. Mei, U. Gennser, and E. S. Yang, "Effects of Ge concentration on SiGe oxidation behavior," Appl. Phys. Lett., vol. 59, No. 10, pp. 1200-1202, Sep. 1991.

D. Guo et al., "FINFET technology featuring high mobility SiGe channel for 10nm and beyond," VLSI 2016, pp. 1-2.

G. Rzepa et al., "Complete extraction of defect bands responsible for instabilities in n and pFinFETs," VLSI 2016, pp. 1-2.

J. Franco et al., "SiGe Channel Technology: Superior Reliability Toward Ultrathin EOT Devices;Part I: NBTI," IEEE Trans. Electron Devices, vol. 60, No. 1, pp. 396-404, Jan. 2013.

J. Franco et al., "Gate stack thermal stability and PBTI reliability challenges for 3D sequential integration: Demonstration of a suitable gate stack for top and bottom tier nMOS," IRPS 2017, p. 2B-3.1-2B-3.5.

Hobbs, et al, "High-k metal-gate pmos finfet threshold voltage tuning with aluminum implantation," 1 AIP Conference Proceedings vol. 1496, Issue 1, 10.1063/1.4766484, Nov. 30, 2012.

Hobbs, et al., "Simple finfet gate doping technique for dipoleengineered vt tuning and cet scaling," Published in: VLSI Technology Systems and Applications (VLSI-TSA), 2012 International Symposium on Date of Conference: Apr. 23-25, 2012, Jun. 2012 INSPEC Accession, IEEE, Jun. 4, 2012.

T. Ando; M. Copel, J. Bruley, M. M. Frank, H. Watanabe, and V. Narayanan, "Physical origins of mobility degradation in extremely scaled SiO2/HfO2 gate stacks with La and Al induced dipoles," Appl. Phys. Lett., vol. 96, No. 13, p. 132904, Mar. 2010.

(56) References Cited

OTHER PUBLICATIONS

J. Franco, B. Kaczer, and G. Groeseneken, Reliability of high mobility SiGe channel MOSFETs for future CMOS applications. Dordrecht: Springer, 2014, Part 1.
J. Franco, B. Kaczer; and G. Groeseneken, Reliability of high mobility SiGe channel MOSFETs for future CMOS applications. Dordrecht: Springer, 2014, Part 2.
J. Franco, B. Kaczer, and G. Groeseneken, Reliability of high mobility SiGe channel MOSFETs for future CMOS applications. Dordrecht: Springer, 2014, Part 3.
Franco et al., Reliability of High Mobility SiGe Channel MOSFETs for Future CMOS Applications, Springer Series in Advanced Microelectronics, vol. 47, 2014.
Li et al., Self-Decomposition of Sio2 due to Si-chemical Potential Increase in SiO2 between HfO2 and Substrate, IEEE 2015.
Ragnarsson et al., Ultra Low-EOT (5 A) Gate-First and Gate-Last High Perfomance CMOS Achieved by Gate-Electrode Optimization, IEEE, 2009.
Takashi Ando, Ultimate Scaling of High-k Gate Dielectrics: Higher-k or Interfacial Layer Scavenging?, Materials 2002, vol. 5, pp. 478-500, Mar. 14, 2012.
Yeo et al., Effects of High-k Gate Dielectric Materials on Metal and Silicon Gate Workfunctions, IEEE Electron Device Letters, vol. 23, No. 6, Jun. 2002, pp. 342-344.
Weimer et al., Materials for and Performance of Multilayer Lithography Schemes, Advances in Resist Materials and Processing Technology XXIV, Proceedings of the SPIE, vol. 6519, article id. 65192S, Mar. 2007.

\* cited by examiner

FIG. 14

METHOD OF FORMING MULTI-THRESHOLD VOLTAGE DEVICES USING DIPOLE-HIGH DIELECTRIC CONSTANT COMBINATIONS AND DEVICES SO FORMED

CROSS-REFERENCE TO RELATED APPLICATIONS

This application claims the benefit of provisional Patent Application Ser. No. 62/587,327, filed Nov. 16, 2017, entitled "METHOD FOR FORMING MULTI-Vt DEVICES FOR CMOS USING A PAIR OF DIPOLE AND HIGH K DIELECTRICS", assigned to the assignee of the present application, and incorporated herein by reference.

BACKGROUND

For various applications, it may be desirable to provide semiconductor devices in which the component transistors have differing threshold voltages. Such semiconductor devices are termed multi-threshold voltage (multi-Vt) devices. For example, a particular integrated circuit may combine SRAM and logic. SRAM transistors typically require a higher Vt than logic transistors. Low threshold voltage (LVt) transistors may thus be used for logic portions of the semiconductor device, while regular threshold voltage (RVt) transistors may be used for the SRAM portions of the semiconductor device. Consequently, multi-Vt semiconductor devices incorporating transistors having differing Vts are desired.

Conventional methods for providing multi-Vt devices rely heavily on a stack including a reactive work function metal (such as Al and/or Ti) placed on top of a mid-gap work function metal (such as TaN and/or TiN) for tuning Vt of the devices. For example, a stack consisting of TiN/TaN/TiN/TiAlC/TiN may be provided on a high dielectric constant layer for use as a transistor gate. The shift in Vt of the transistor depends upon the thicknesses of the layers of stack. The TiN/TaN/TiN/TiAlC/TiN stack typically has a large thickness to provide the desired range of Vt. For example, while functional for close to twenty nanometer spacings, the TiN/TaN/TiN/TiAlC/TiN stack, placed on top of a high dielectric constant layer (a few nanometers thick), may start to merge for replacement metal gate (RMG) spacings on the low teens of nanometers.

The current scaling trend in semiconductor devices has rendered a lower RMG spacing for achieving higher device density. Architectures such as fin field effect transistors (finFETs), gate all around FET (GAA-FET) and replacement metal gate FET (RMG-FET) exist to address certain critical issues at scaled nodes, such as the short channel effect (SCE). However, such architectures do not specifically address issues in multi-Vt devices. Although the use of a work function metal stack works very well for current nodes, at lower spacings at extreme scaled nodes issue arise. As the RMG spacing decreases from scaling, the relatively thick work function metal stack may merge. Stated differently, a work function metal stack that is sufficiently thick to provide the desired shift in Vt may not be capable of fitting into the RMG spacing available given the topology of the underlying surface at extreme scaled nodes. As discussed above, such a stack may start to merge at lower spacings. The variation in Vt (sigma Vt) may also increase as multi-Vt devices are scaled to lower sizes. This is because random variations in the electron work function (eWF) are exacerbated for polycrystalline work function metals at lower sizes.

Mechanisms to shift Vt without increasing the thickness of the work function metal stack and to address variations in eWF exist. However, each method has its drawbacks. Consequently, an improved mechanism for controlling the threshold voltage of a multi-Vt semiconductor device is desired.

BRIEF SUMMARY OF THE INVENTION

A method provides a gate structure for a plurality of components of a semiconductor device. The method provides a first dipole combination on a first portion of the components. The first dipole combination includes a first dipole layer and a first high dielectric constant layer on the first dipole layer. A second dipole combination is provided on a second portion of the components. The second dipole combination includes a second dipole layer and a second high dielectric constant layer on the second dipole layer. The first dipole combination is different from the second dipole combination. At least one work function metal layer is provided on the first dipole combination and the second dipole combination. A low temperature anneal is performed after the step of providing the work function metal layer(s). A contact metal layer is formed on the work function metal layer.

The method described herein may provide different shifts in the threshold voltage of a transistor using the dipole combination. The first and second dipole combinations are also thin, generally less than two nanometers in thickness. Further, the dipole combinations may displace the defect bands of the high dielectric constant layers such that the carriers from the semiconductor interact with the defects inside the defect bands of the high dielectric constant layers to a much lesser extent. Thus, an improvement in mobility and reliability may be achieved. Consequently, multi-Vt transistors having improved performance may be provided at more extreme scaled nodes.

DETAILED DESCRIPTION OF THE INVENTION

The exemplary embodiments relate to formation of multi-Vt semiconductor devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations.

Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

A method provides a gate structure for a plurality of components of a semiconductor device. A silicate layer is provided. In one aspect, the silicate layer is provided on a channel of a CMOS device. A high dielectric constant layer is provided on the silicate layer. The method also includes providing a work function metal layer on the high dielectric constant layer. A low temperature anneal is performed after the work function metal layer is provided. A contact metal layer is provided on the work function metal layer.

Figure 1:
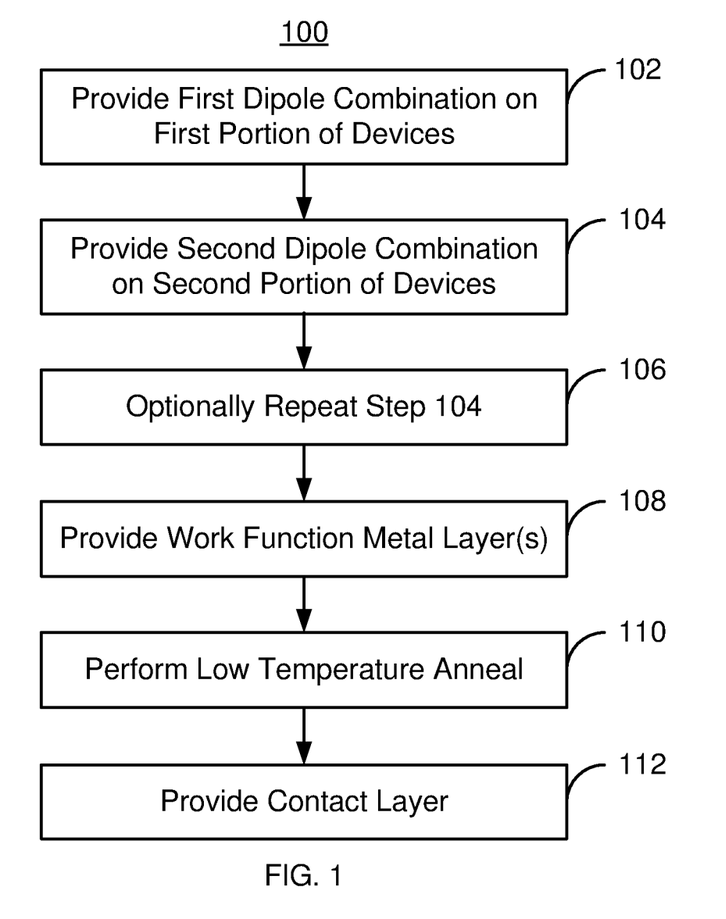
FIG. 1 is a flow chart depicting an exemplary embodiment of a method for providing a multi-Vt gate structure in a semiconductor device.

FIG. 1 is a flow chart depicting an exemplary embodiment of a method 100 for providing a gate structure for components, i.e. transistors, in a semiconductor device. For simplicity, some steps may be omitted, performed in another order and/or combined. Further, the method 100 may start after other steps in forming the semiconductor device have been performed. For example, the method may start after source and drain regions have been defined and various structures provided. FIGS. 2A-2D depict portions of an exemplary embodiment of a semiconductor device 200, such as a MOS device, during fabrication of the gate structures using the method 100. For simplicity, not all components are shown in FIGS. 2A-2D and FIGS. 2A-2D are not to scale. For example, various structures that may have been formed prior to the gate structure are not shown. Further, the thickness of the layers may be exaggerated for explanatory purposes. Although a single device of each dipole combination is shown as being fabricated, one of ordinary skill in the art will recognize that multiple components of each type are generally formed. In some embodiments, all of the transistors on the semiconductor device 200 may include dipole combinations. In other embodiments, some transistors (not shown) may not include the dipole combinations. The method 100 is described in the context of the semiconductor device 200. However, nothing prevents the method 100 from being used with a different semiconductor device.

A first dipole combination is provided on a first portion of the components, via step 102. The first dipole combination includes a first dipole layer and a first high dielectric constant layer on the first dipole layer. In some embodiments, formation of the first high dielectric constant layer may be carried out at temperatures of at two hundred degrees Celsius and not more than six hundred degrees Celsius. The high dielectric constant layer has a dielectric constant greater than that of $SiO_2$. An interfacial/natural oxide layer, such as $SiO_2$, may be formed prior to deposition of the first dipole layer. Step 102 may be carried out by covering remaining regions of the semiconductor device by a mask and depositing the first dipole combination. The mask and layers in the first dipole combination may then be removed from remaining portions of the semiconductor device.

The first dipole combination provided in step 102 is used in formation of dipoles, discussed below, which are effective in shifting the threshold voltage, Vt, of the component being formed. The first high dielectric constant layer may include one or more of $HfO_2$, $ZrO_2$, HfSiOx, HfZrOx and ZrALOx, where Ox indicates an oxide with varying stoichiometry. The materials used in dipole layer provided in step 102 may be selected to provide the desired magnitude and direction of the shift in Vt. For example, the first dipole layer may include one or more of $Lu_2O_3$, LuSiOx, $Y_2O_3$, YSiOx, $La_2O_3$, LaSiOx, BaO, BaSiOx, SrO, SrSiOx, $Al_2O_3$, AlSiOx, $TiO_2$, TiSiOx, $HfO_2$, HfSiOx, $ZrO_2$, ZrSiOx, $Ta_2O_5$, TaSiOx, ScO, ScSiOx, MgO, and MgSiOx, where Ox indicates an oxide with a varying stoichiometry. The atomic percentage of elements in the first dipole layer may also be varied. For example, the silicon content in a silicate layer may range from zero to not more than seventy atomic percent. The silicon content in the silicate may be used to tailor the shift in Vt. The material selected depends upon the sign of the voltage shift desired and the designated devices (i.e., nFETs or pFETs) being formed. If the component being fabricated is an nFET and Vt is desired to be shifted downwards (negatively) then in some embodiments, the first dipole layer provided in step 102 may include one or more of $Lu_2O_3$, LuSiOx, $Y_2O_3$, YSiOx, $La_2O_3$, LaSiOx, BaO, BaSiOx, SrO, $SrSiO_x$, MgO, and MgSiOx. If the component being fabricated is an nFET and Vt is desired to be shifted upwards (positively) then the first dipole layer provided in step 102 may include at least one of $Al_2O_3$, AlSiOx, $TiO_2$, TiSiOx, $HfO_2$, HfSiOx, $ZrO_2$, ZrSiOx, $Ta_2O_5$, TaSiOx, ScO, ScSiOx, MgO, and MgSiOx. If the component being fabricated is a pFET and Vt is desired to be shifted upwards, then the first dipole layer provided in step 102 may include at least one of $Lu_2O_3$, LuSiOx, $Y_2O_3$, YSiOx, $La_2O_3$, LaSiOx, BaO, BaSiOx, SrO, SrSiOx. If the component being provided is a p-FET and Vt is desired to be shifted downwards, then the first dipole layer provided in step 102 may include one or more of $Al_2O_3$, AlSiOx, $TiO_2$, TiSiOx, $HfO_2$, HfSiOx, $ZrO_2$, ZrSiOx, $Ta_2O_5$, TaSiOx, ScO, ScSiOx, MgO, and MgSiOx. Other materials may be used in the first dipole layer to shift the voltage up or down in other embodiments. Thus, by selection of the appropriate material for dipole layer and configuring the thickness of the dipole layer, desired shift in Vt may be obtained for the first set of devices.

The dipole combination provided in step 102 may have a total thickness that does not exceed three nanometers. In some such embodiments, the dipole combination has a total thickness of not more than two nanometers. In some embodiments, the thickness of the first high dielectric constant layer is at least 0.1 nanometer and less than two nanometers. In some such embodiments, the thickness of the first high dielectric constant layer is nominally one nanometer. In some embodiments, the thickness of the first dipole layer is at least 0.1 nm and not more than one nanometer. Thicknesses in this range (one through ten Angstroms) may be sufficient to shift the Vt of the device being fabricated by up to hundreds of millivolts. Consequently, judiciously selecting the materials in the first dipole layer and the first high dielectric constant layer in combination with tailoring the thickness of the first dipole layer provided in step 102 provides an effective mechanism for setting the Vt of the devices being fabricated to the desired levels.

Figure 2A:
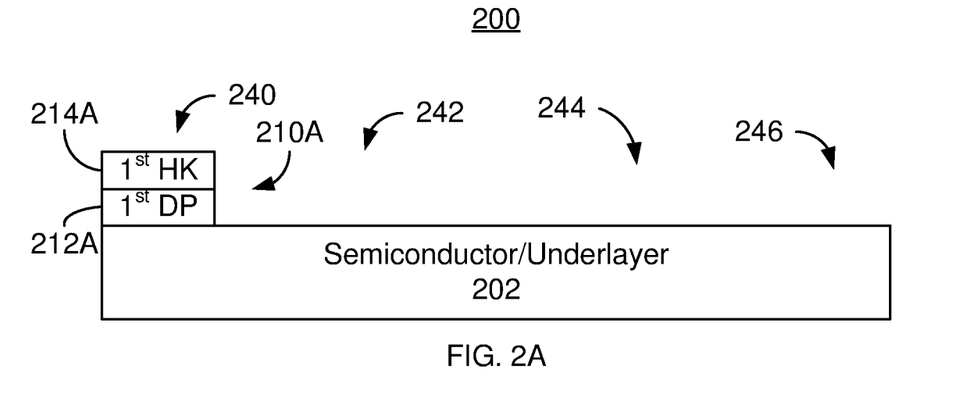
FIGS. 2A-2D depict portions of an exemplary embodiment of a gate structures during fabrication.

FIG. 2A depicts the semiconductor device 200 after step 102 is performed. For simplicity, the layers are depicted as being only in regions in which components are to be formed and other structures such as spacers, interconnects or other features are not shown. However, some or all of the layers may extend beyond the devices being fabricated. The layers are also depicted as being planar. However, in some embodiments, the layers may be three dimensional, for example if the underlying structure is a semiconductor fin. Also, as previously mentioned, the thicknesses and other dimensions shown in FIGS. 2A-2D are not to scale.

Components 240, 242, 244 and 246 are being fabricated and may each be a transistor. The underlying semiconductor 202 is shown. In some embodiments, the semiconductor 202 is Si. In other embodiments, other substrates including but not limited to SiGe, SOI, sSOI, SGOI, sSGOI and analogous substrates that allow for a natural SiOx formation. Thus, this natural SiOx, is termed an "interfacial oxide" because it is at the interface of the semiconductor/channel 202 and the dipole, discussed below. This interfacial oxide is not shown in the drawings for simplicity. First dipole combination 210A has been provided. The first dipole combination 210A includes a first dipole layer 212A and a first high dielectric constant layer 214A. The material(s) used for the layers 212A and 214A are described above.

A second dipole combination is provided on a second portion of the components, via step 104. The second dipole combination includes a second dipole layer and a second high dielectric constant layer on the second dipole layer. In some embodiments, the interfacial/natural oxide layer, has formed prior to deposition of the second dipole layer. The second dipole combination provided in step 104 is used in formation of dipoles that shift the threshold voltage, Vt, of the component being formed. The material(s) and thicknesses of the second dipole layer and the second high dielectric constant layer are analogous to those described above for the first dipole layer and the first high dielectric constant layer, respectively. The material(s) and thicknesses are also selected to provide the desired magnitude and direction (upward/positive or downward/negative) of the shift in Vt. Step 104 is thus analogous to step 102.

However, the second dipole combination differs from the first dipole combination. In some embodiments, only the first dipole layer differs from the second dipole layer. For example, the first dipole layer may be LaSiOx, the second dipole layer may be MgO and the first and second high dielectric constant layers may be formed of the same material. In other embodiments, only the first high dielectric constant layer differs from the second high dielectric constant layer. For example, the first high dielectric constant layer may be $HfO_2$, the second high dielectric constant layer may be $ZrO_2$ and the first and second dipole layers may be formed of the same material. In other embodiments, both the first and second dipole layers differ and the first and second high dielectric constant layers may differ. For example, the first dipole layer may be LaSiOx, the second dipole layer may be AlSiOx, the first high dielectric constant layer may be $HfO_2$ and the second high dielectric constant layer may be ZrAlOx. Thus, the second dipole combination is different from the first dipole combination and may provide a different shift in Vt.

Figure 2B:
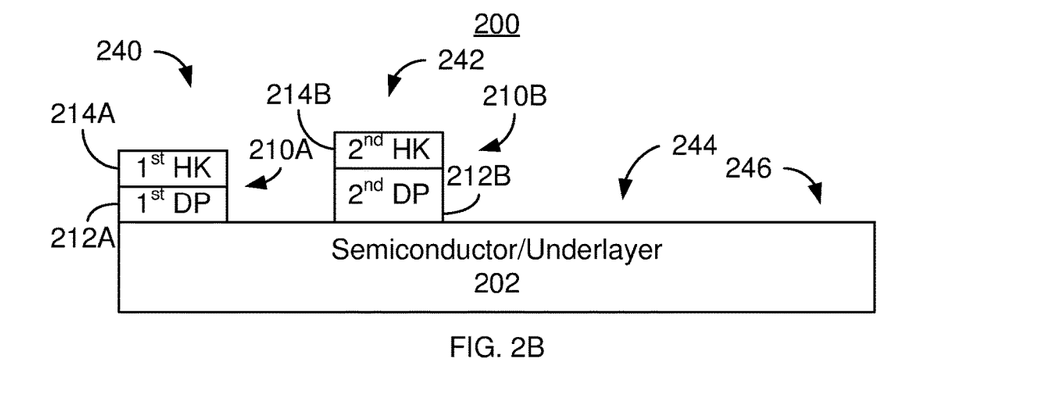

FIG. 2B depicts the semiconductor device 200 after step 104 is performed. Thus, a second dipole combination 210B has been provided for device 242. The second dipole combination 210B includes a second dipole layer 212B and a second high dielectric constant layer 214B. The material(s) that can be used for the layers 212B and 214B are described above. However, as discussed above, the second dipole combination 210B is different than the first dipole combination 210A. Thus, the component 242 has a different shift in Vt than the component 240.

Step 104 may optionally be repeated a number of times for different regions and different dipole combinations, via step 106. In addition, work function metal layer(s) are provided, via step 108. Although all metals can be characterized by a work function, the layer is termed a work function metal layer because the electron work function (eWF) for the metal is a factor in determining Vt for the devices being formed. For example, the work function metal layer may include at least one of TiN, TaN, TiSiN, TiTaN, WN and TiTaSiN. Other metals may be used in other embodiments. The work function metal is also relatively thin. For example, the work function metal has a thickness of at least one nanometer and not more than three nanometers. In some embodiments, the same work function metal, such as TiN, may be provided on all of the components 240, 242, 244 and 246. In other embodiments, different work function metals may be provided on different components. In some embodiments, the work function metal may be individually provided on each dipole combination. For example, a work function metal may be provided on the first dipole combination 210A before the second dipole combination is provided in step 104. Alternatively, the work function metal(s) may be provided after all of the dipole combinations have been deposited in steps 102, 104 and 106.

Figure 2C:
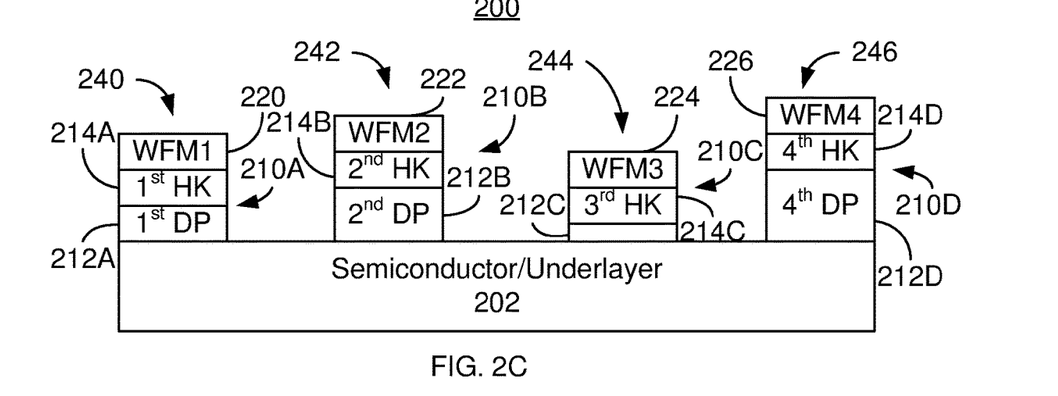

FIG. 2C depicts the semiconductor device 200 after step 108 has been performed. Consequently, components 244 and 246 include dipole combinations 210C and 210D, respectively. The dipole combination 210C includes a third dipole layer 212C and a third high dielectric constant layer 214C. Similarly, the dipole combination 210D includes a fourth dipole layer 212D and a fourth high dielectric constant layer 214D. The third dipole combination 210C is different from the first dipole combination 210A and from the second dipole combination 2108. The fourth dipole combination 210D is different from the first dipole combination 210A, the second dipole combination 210B and the third dipole combination 210C. Thus, each of the components 240, 242, 244 and 246 has a different shift in Vt. In addition, a work function metal layer 220, 222, 224 and 226 has been provided for each component 240, 242, 244 and 246, respectively.

A low temperature anneal is performed after the work function metal layers 220, 222, 224 and 226 have been formed, via step 110. The low temperature anneal may be used to homogenize the mixing of the dipole layers 212A, 212B, 212C and 212D and the high dielectric constant layers 214A, 214B, 214C and 214D, respectively, at the interface.

In addition, the anneal may aid in controlling the final Vt. Step 110 may include performing an anneal at an anneal temperature of at least two hundred degrees Celsius and not more than eight hundred degrees Celsius. In some embodiments, the maximum anneal temperature is not more than six hundred degrees Celsius. In some embodiments, the anneal temperature is at least three hundred degrees Celsius. In some such embodiments, the temperature of the anneal is at least four hundred degrees Celsius. In other embodiments, the anneal temperature may be at least four hundred degrees Celsius and not more than five hundred degrees Celsius.

In some embodiments, the anneal in step 110 is performed with a sacrificial reactive metal layer (not shown in FIGS. 2A-2D). Such a reactive metal layer would generally be removed after the anneal. The reactive metal layer may include one or more of Si, Ti, Zr, Hf and La and may have a thickness of not more than four nanometers. Other materials and other thicknesses may be used. Such a metal may be used on one or more of the components 240, 242, 244 and 246 during the anneal for additional control in the final threshold voltage. Alternatively, such a reactive metal layer might be omitted from some or all of the components 240, 242, 244 and 246.

Figure 2D:
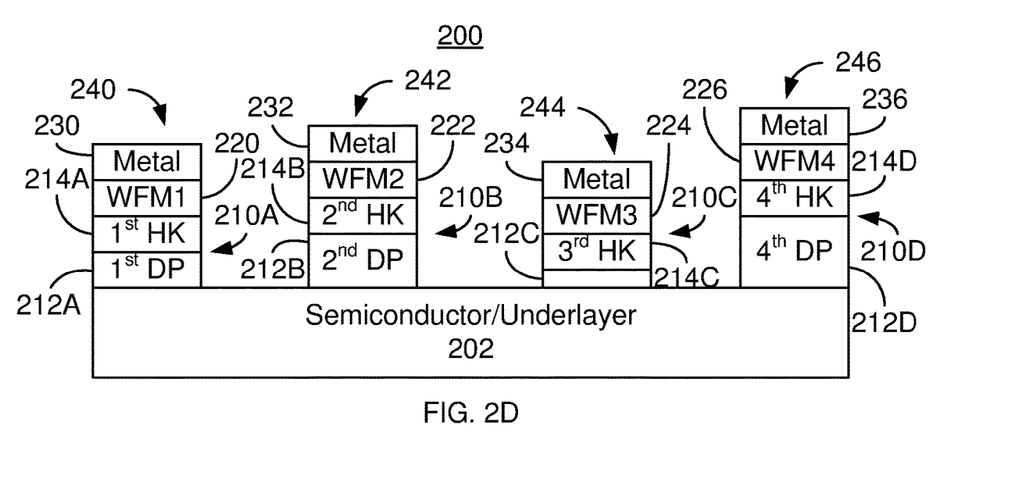

A contact metal layer is provided on the work function metal layer, via step 112. In some embodiments, the contact metal layer may be W or Co. However, other metals may be used in other embodiments. FIG. 2D depicts the semiconductor device 200 after step 110 has been performed. Consequently, metal contacts 230, 232, 234, and 236 have been provided for each of the devices 240, 242, 244 and 246, respectively. Fabrication of the semiconductor device 200 may then be completed.

Using the method 100, the Vt of the transistors 240, 242, 244 and 246 may be separately tuned, such that the semiconductor device 200 is a multi-Vt device. The work function metal 220 used in the transistors 240, 242, 244 and 246 sets baseline Vt for each of the transistors 240, 24, 244 and 246. The dipoles formed using the dipole combinations 210A, 210B. 210C and 210D may shift the baseline Vt up or down, depending upon the material(s) and thickness(es) used in the dipole layers 212A, 212B, 212C and 212D. As discussed above, use of a sacrificial reactive metal layer during the low temperature anneal may provide fine adjustments to the Vt. Thus, a multi-Vt semiconductor device 200 may be provided.

The semiconductor device 200 and method 100 are appropriate for significantly smaller devices. As indicated above, the work function metal layer 220, 222, 224 and 226 has a maximum thickness of approximately three nanometers in some embodiments. This thickness is significantly less than the total thickness of a work function metal stack (e.g. TiN/TaN/TiAlC/TiN) used in conventional approaches. This layer 220 provides the baseline Vt. Shifts in the Vt may be provided using the dipole combinations 210A, 210B, 210C and 210D. The thickness(es) for the dipole combinations 210A, 210B, 210C and 210D may be less than two nanometers. Variations in the material(s) used and in the thicknesses of the dipole combinations 210A, 210B, 210C and 210D of less than one nanometer in connection with the material(s) used may provide sufficient shifts in the baseline Vt. Thus, a multi-Vt device 200 may be provided without requiring a large total thickness of the stack of layers 210A/210/210C/210D, 220/222/224/226 and 230/232/234/236. Using the method 100, a multi-Vt device 200 consistent with RMG spacings on the order of seven to eight nanometers or less may be fabricated. The stack may also be sufficiently thin that remaining space can be used for contact metal fills. This may reduce resistivity. Other technologies with small spacing and/or larger RMG spacings can readily be fabricated using the method 100. Thus, the method 100 may provide multi-Vt devices 200 that can be scaled to significantly smaller sizes.

The method 100 may also improve performance. Defect bands are an intrinsic property of high dielectric constant materials. For example, the materials used in the high dielectric constant layers 214A, 214B, 214C and 214D each have defect bands. The dipole combinations 210A, 210B, 210C and 210D may displace the defect bands of the high dielectric constant layers 214A, 214B, 214C and 214D. Carriers from the underlying semiconductor interact with the displaced defect bands and may encounter reduced defect traps. Thus, the semiconductor device 200 may have improved mobility and reliability. This benefit may have a weak dependence upon thickness because the thickness variation in the dipole layers 212A/212B/212C/212D for the desired Vt shift may be small (e.g. less than one nanometer). Stated differently, the improvement in mobility and reliability is expected to be relatively insensitive to the thicknesses of the dipole combinations 210A/210B/210C/210D for the thickness ranges described herein. Consequently, multi-Vt transistors having improved performance may be provided at more extreme scaled nodes.

The method 100 may also improve manufacturability. The stack used for the components 240, 242, 244 and 246 does not contain aluminum in at least some embodiments. Consequently, aluminum-related highly temperature sensitive issues may be avoided. The dipole voltage induced may not have crystalline orientation dependency. This implies that local sigma Vt issues from the thick, conventional stack may be mitigated or avoided. Thus, the method 100 and multi-Vt device 200 have improved performance and manufacturability, particularly at smaller device sizes.

Figure 3:
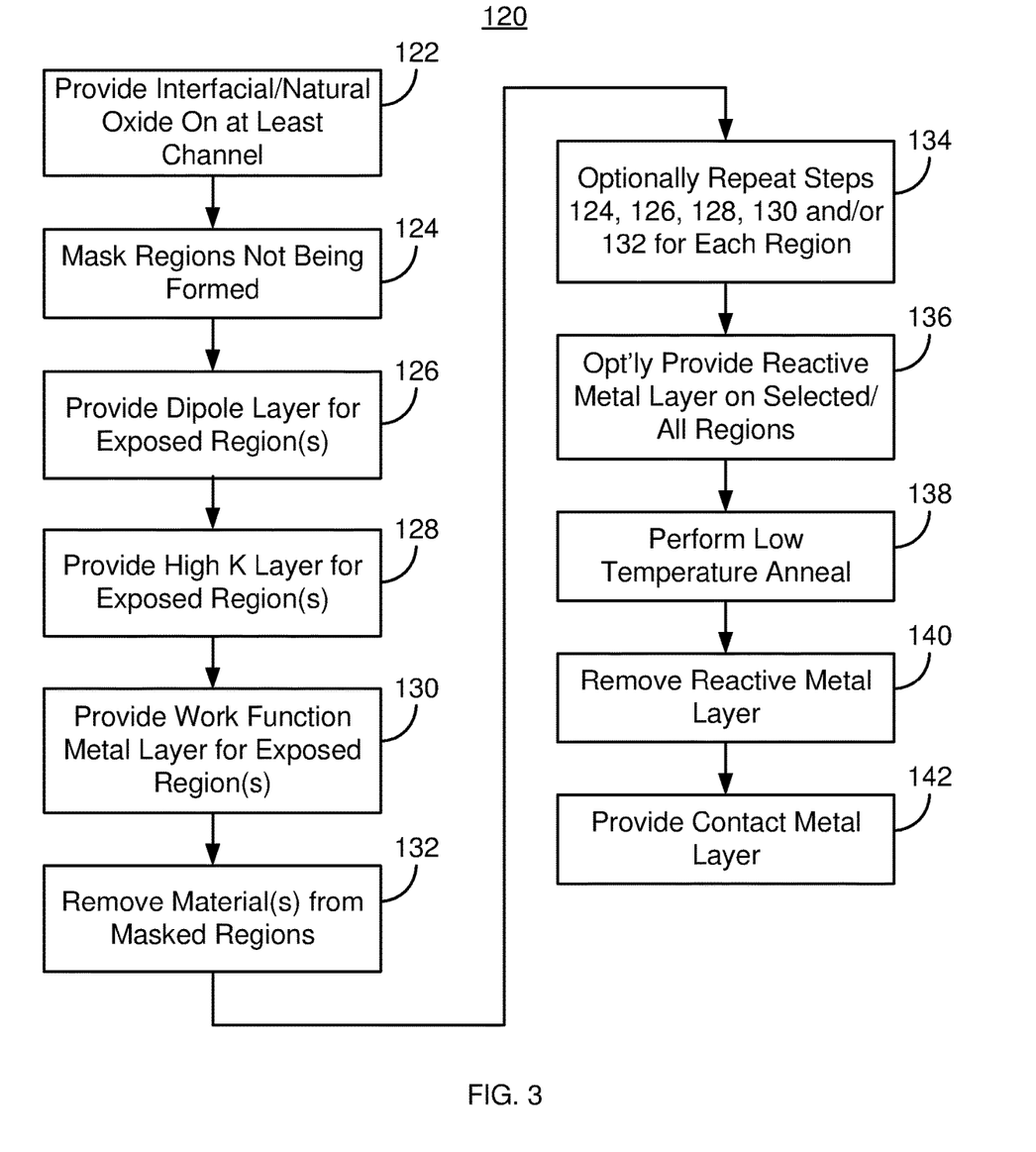
FIG. 3 is a flow chart depicting an exemplary embodiment of a method for providing a multi-Vt transistors in a semiconductor device.

FIG. 3 is a flow chart depicting an exemplary embodiment of a method 120 for providing a gate structure for transistors in a multi-Vt semiconductor device. For simplicity, some steps may be omitted, performed in another order and/or combined. Further, the method 120 may start after other steps in forming the semiconductor device have been performed. For example, the method may start after source and drain regions have been defined and various structures provided. FIGS. 4-14 depict portions of an exemplary embodiment of a semiconductor device 250, such as a MOS device, during fabrication of the gate structures using the method 100. For simplicity, not all components are shown in FIGS. 4-14 and FIGS. 4-14 are not to scale. For example, various structures that may have been formed prior to the gate structure are not shown. The thickness of the layers may be exaggerated for explanatory purposes. For clarity, only the structures in the region of the transistors being formed are shown. Thus, the underlying topology has not been indicated. The transistors formed are not, however, limited to planar transistors. Instead, the method 120 may be incorporated into other architectures including but not limited to FinFETs, GAA-FETS and RMG-FETs. Although a single device of each dipole combination is shown as being fabricated, one of ordinary skill in the art will recognize that multiple components of each type are generally formed. In some embodiments, all of the transistors formed on the semiconductor device 250 may include dipole combinations. In other embodiments, some transistors (not shown) may not include the dipole combinations. The method 120 is described in the context of the semiconductor device 250. However, nothing prevents the method 120 from being used with a different semiconductor device.

A thin interfacial/natural oxide layer is formed on at least the channel regions, via step 122. The interfacial oxide may include SiOx and may be naturally formed on the channel as well as other regions of the substrate. In some embodiments, the semiconductor is selected from Si, SiGe, SOI, sSOI, SGOI, sSGOI and analogous substrates that allow for a natural SiOx formation.

Figure 4:
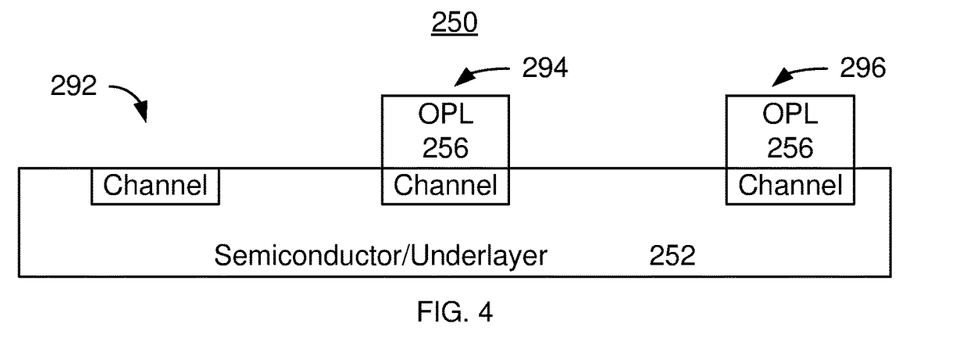
FIGS. 4-14 depict portions of an exemplary embodiment of a multi-Vt semiconductor device during fabrication.

A mask is provided on the regions in which the dipole combinations are currently not being formed, via step 124. Step 124 may include forming an organic planarization layer (OPL) in selected regions. FIG. 4 depicts the semiconductor device 250 after step 124 is performed. Transistors 292, 294 and 296 are being fabricated. The underlying semiconductor 252 is shown. For simplicity, the interfacial oxide formed on the underlying semiconductor 252 is not shown. A mask 256 resides on transistors 294 and 296. In the embodiment shown, the mask 256 is an OPL.

A dipole layer for the exposed portion of the transistors is deposited, via step 126. The dipole layer may include one or more of $Lu_2O_3$, LuSiOx, $Y_2O_3$, YSiOx, $La_2O_3$, LaSiOx, BaO, BaSiOx, SrO, SrSiOx, $Al_2O_3$, AlSiOx, $TiO_2$, TiSiOx, $HfO_2$, HfSiOx, $ZrO_2$, ZrSiOx, $Ta_2O_5$, TaSiOx, ScO, ScSiOx, MgO, and MgSiOx, depending upon the conductivity type (n-type or p-type) of the transistor being formed as well as the direction (positive or negative) of the desired shift in Vt. Other materials may be used in the dipole layer to shift the voltage up or down in other embodiments. Step 126 may be performed using atomic layer deposition (ALD) at temperatures of around three hundred degrees Celsius.

A high dielectric constant layer for the exposed regions is provided on the dipole layer, via step 128. In some embodiments, formation of the high dielectric constant layer may be carried out at temperatures of at two hundred degrees Celsius and not more than six hundred degrees Celsius. In some embodiments, formation of the high dielectric constant layer may be at temperatures not exceeding three hundred degrees Celsius. For example, step 128 may be performed using ALD at temperatures of around three hundred degrees Celsius. The high dielectric constant layer may include one or more of $HfO_2$, $ZrO_2$, HfSiOx, HfZrOx and ZrALOx in some embodiments. The layers provided in steps 126 and 128 form a first dipole combination. The total thickness of the layers provided in steps 126 and 128 may not exceed two nanometers.

A work function metal layer for the exposed regions is provided on the high dielectric constant layer, via step 130. For example, the work function metal layer may include at least one of TiN, TaN, TiSiN, TiTaN, WN and TiTaSiN. Other metals may be used in other embodiments. The work function metal is also relatively thin. For example, the work function metal thickness of not more than three nanometers.

Figure 5:
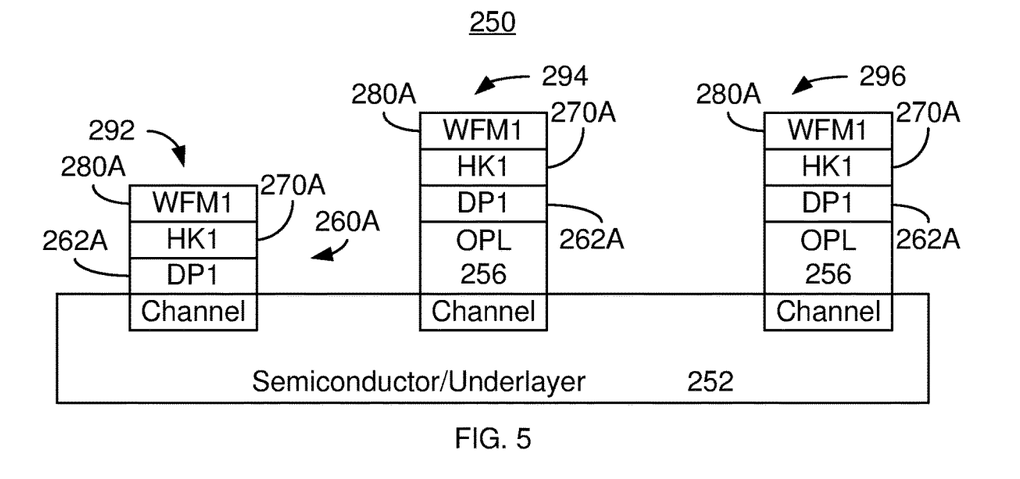

FIG. 5 depicts the semiconductor device 250 after step 130 has been performed. A dipole layer DP1 262A, a high dielectric constant layer HK1 270A and a work function metal layer WFM1 280A have been provided. The dipole layer 262A and the high dielectric constant layer 270A form a dipole combination 260A. For the exposed transistor 292, the layers 262A, 270A and 280A are on the interfacial/natural oxide (not shown) on the semiconductor 252. For the remaining transistors 294 and 296 covered by the OPL mask 256, the layers 262A, 270A and 280A are on the OPL mask 256. The layers 262A, 270A and 280A may be formed using ALD. Thus, the layers 262A, 270A and 280A on the OPL 256 may be of poor quality in comparison with the layers 262A, 270A and 280A formed on the interfacial oxide.

Figure 6:
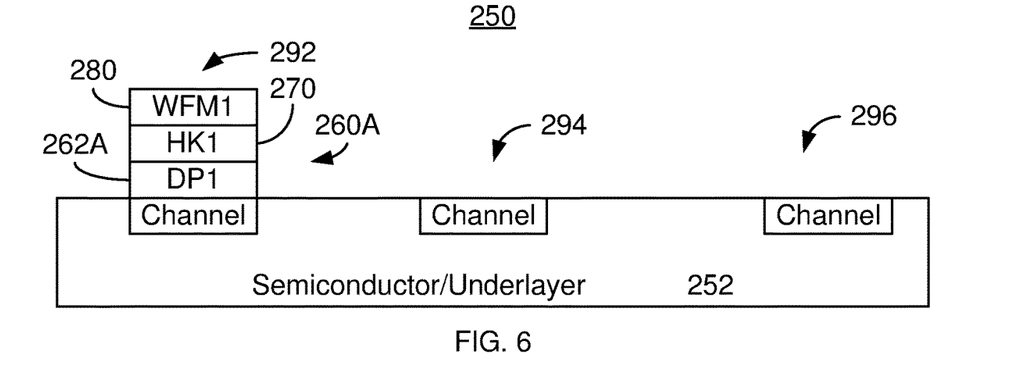

The layers 262A, 270A and 280A are removed from the masked regions, via step 132. Because the layers 262A, 270A and 280A on the OPL 256 may be defective, they are more easily removed than the layers 262A, 270A and 280A formed on the interfacial oxide. More specifically, etchants may more easily penetrate these layers 262A, 270A and 280A on the masked regions. The OPL mask 256 may thus be removed in step 132 and the layers 262A, 270A and 280A on the transistors 294 and 296 lifted off. Consequently, step 132 may remove the portions of the layers 262A, 270A and 280A on transistors 294 and 296 without adversely affecting the transistor 292. FIG. 6 depicts the semiconductor device 280 after step 132 is performed. Thus, the transistor 292 retains the dipole combination 260A and the work function metal layer 270A. In contrast, the interfacial oxide/channel region for transistors 294 and 296 is exposed.

Steps 124, 126, 128, 130 and/or 132 may optionally be repeated for the remaining devices, via step 134. However, the materials for the layers are selected such that different dipole combinations are provided for transistors in each region.

Figure 7:
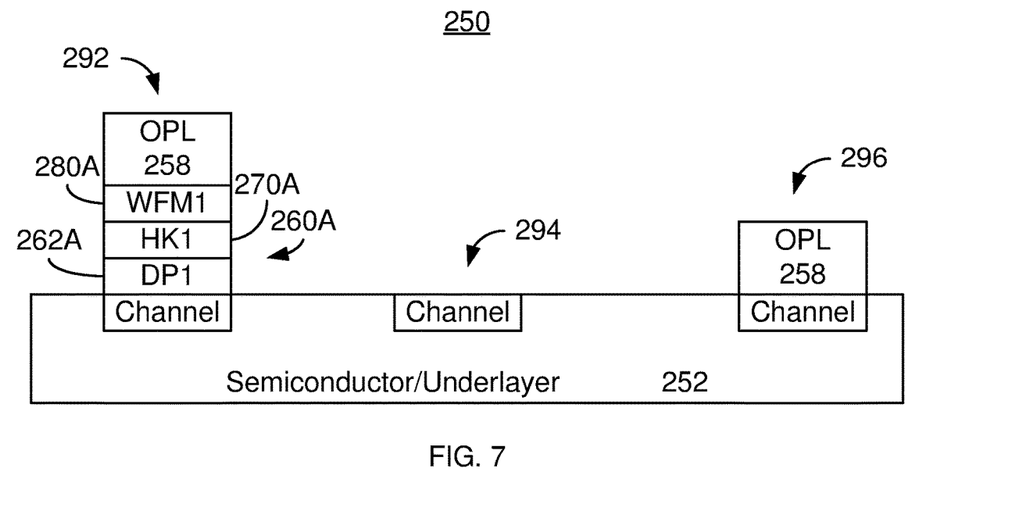
Figure 8:
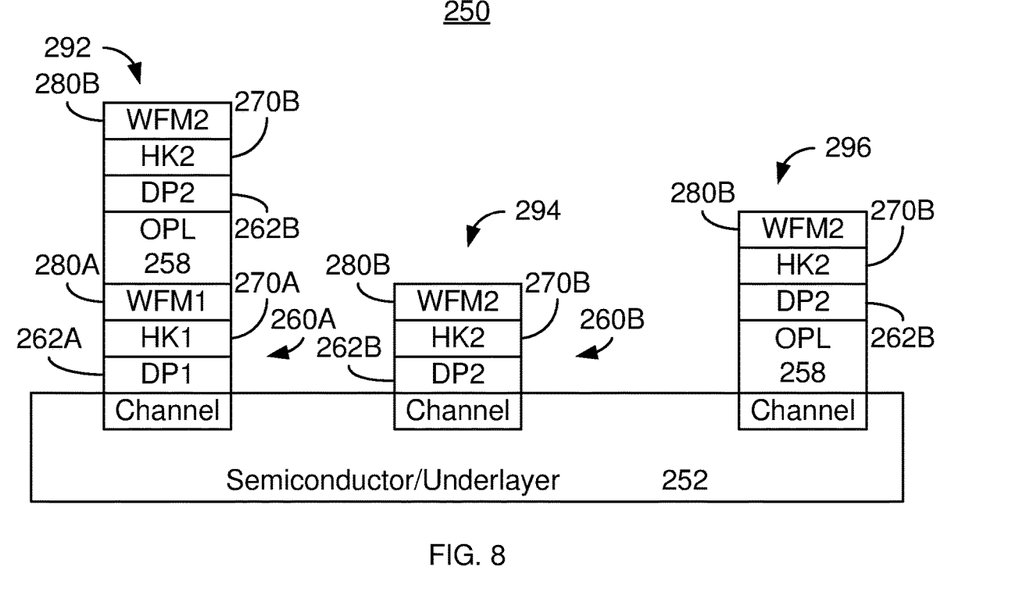

FIG. 7 depicts the semiconductor device 250 after step 124 is repeated for fabrication of the transistor 294. Thus, mask OPL 258 is formed on the regions for transistors 292 and 296. FIG. 8 depicts the semiconductor device 250 after steps 126, 128 and 130 are repeated. Thus, dipole layer DP2 262B, high dielectric constant layer HK2 270B and work function metal layer WFM2 280B have been deposited on devices 292, 294 and 296. The dipole layer 262B and high dielectric constant layer 270B form a second dipole combination 260B. For the transistor 294, the layers 262B, 270B and 280B are on the interfacial/natural oxide on the semiconductor 252. However, these layers 262B, 270B and 280B reside on OPL 258 for transistors 292 and 296. Thus, the layers 262B, 270B and 280B are expected to be of poor quality for transistors 292 and 296.

Figure 9:
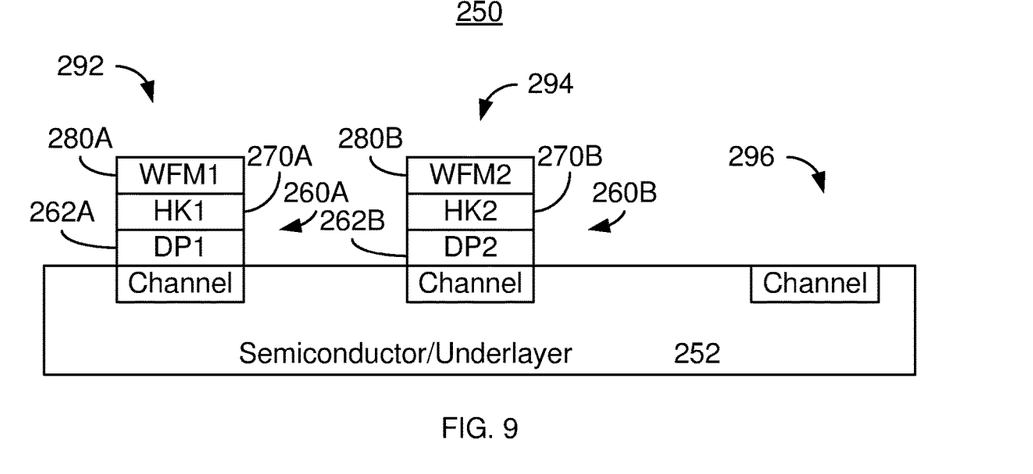

FIG. 9 depicts the semiconductor device 250 after step 132 is performed again and the OPL 258 has been removed. Because of the presence of the OPL 258, the removal step 132 allows lift-off of the relevant layers from the transistors 292 and 296 without undue damage to the transistor 294. Thus, each transistor 292 and 294 includes a dipole combination 260A and 260B, respectively, and a work function metal layer 280A and 280B, respectively. The dipole combinations 260A and 260B differ. The work function metals 280A and 280B may be different or may be the same.

Figure 10:
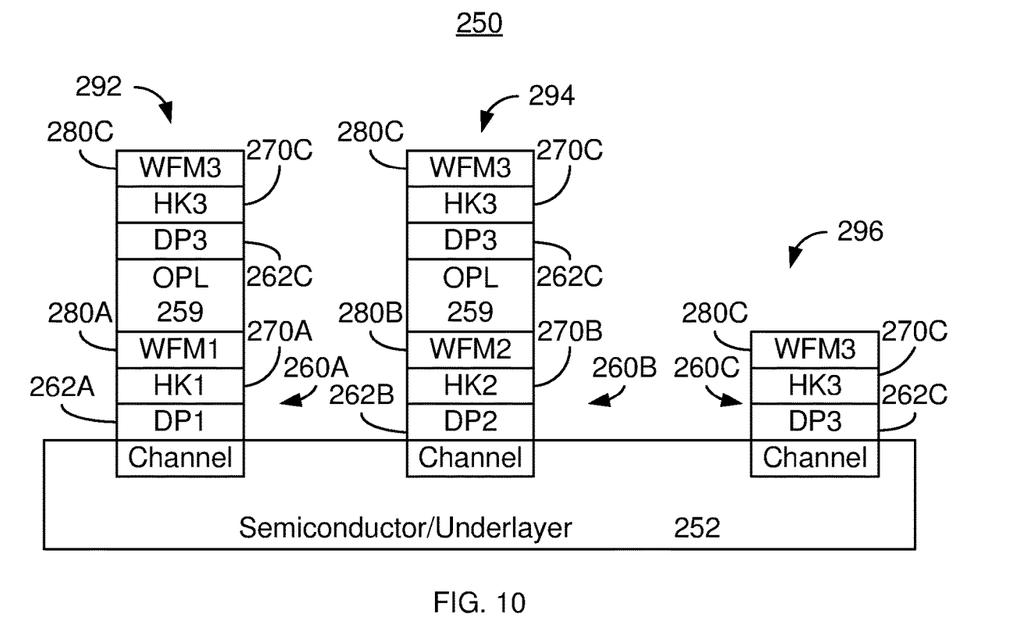

FIG. 10 depicts the semiconductor device 250 after steps 124, 126, 128 and 130 are repeated for the transistor 296. Thus, a mask OPL 259 resides on regions for transistors 292 and 294. A dipole layer DP3 262C, high dielectric constant layer HK3 270C and work function metal layer WFM3 280C have been deposited on devices 292, 294 and 296. The dipole layer 262C and high dielectric constant layer 270C form a third dipole combination 260C. For the transistor 296, the layers 262C, 270C and 280C are on the portion of interfacial oxide above the corresponding channel. However, these layers 262C, 270C and 280C are on OPL 259 for transistors 292 and 294. Thus, the layers 262C, 270C and 280C are expected to be of poor quality for transistors 292 and 294.

Figure 11:
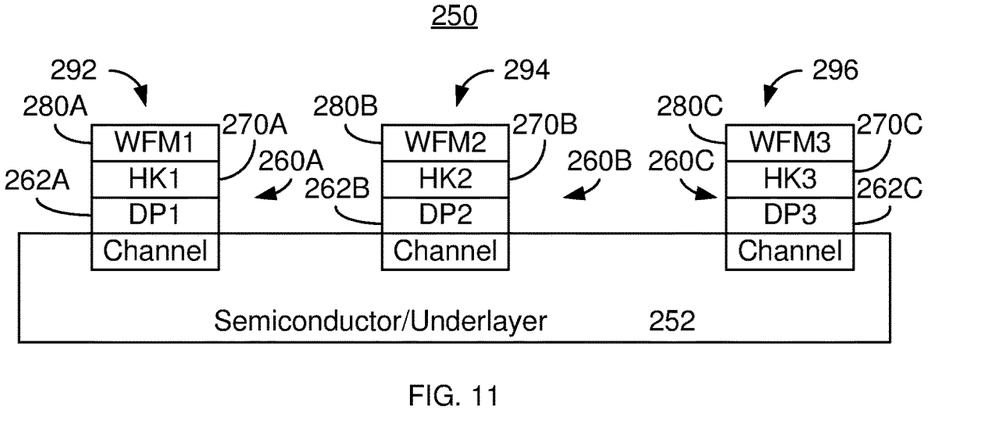

FIG. 11 depicts the semiconductor device 250 after step 132 is repeated and the OPL 259 has been removed. Because of the presence of the OPL 259, the removal step 132 is expected to remove the relevant layers from the transistors 292 and 294 without undue damage to the transistor 296. Thus, the transistors 292, 294 and 296 each include a dipole combination 260A, 260B and 260C, respectively, and work function metal 280A, 280B and 280C, respectively. The dipole combinations 260A, 260B and 260C differ. The work function metals 280A, 280B and 280C may be different or may be the same.

Figure 12:
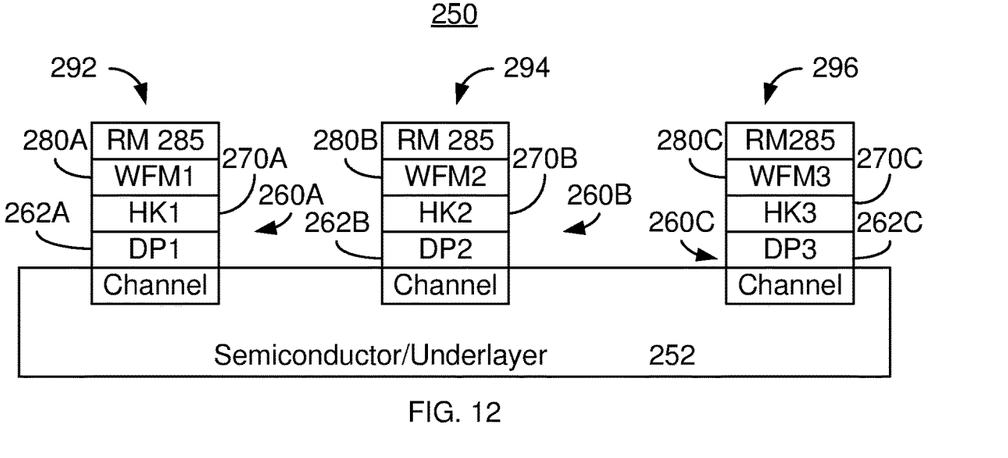

A sacrificial reactive metal layer is optionally provided, via step 136. The reactive metal layer may include one or more of Si, Ti, Zr, Hf and La and may have thickness of not more than four nanometers. Other materials and other thicknesses may be used. Such a metal may be used during the anneal for additional control in the final threshold voltage. Stated differently, the reactive metal layer provided in step 136 provides fine control over the shift in Vt. FIG. 12 depicts the multi-Vt semiconductor device 250 after step 136 is performed. Thus, the reactive metal layer RM 285 has been provided. In the embodiment shown, the reactive metal layer 285 is on all of the transistors 292, 294 and 296. In other embodiments, the reactive metal layer 285 may be omitted from some or all of the transistors 292, 294 and 296.

A low temperature anneal is performed, via step 138. The low temperature anneal may be used to homogenize the mixing of the dipole layer(s) 262A/262B/262C and the high dielectric constant layers 270A/270B/270C, respectively, for the dipole combinations 260A/260B/260C, respectively. Step 138 may include performing an anneal at an anneal temperature of at least two hundred degrees Celsius and not more than eight hundred degrees Celsius. In some embodiments, the maximum anneal temperature is not more than six hundred degrees Celsius. In some such embodiments, the temperature of the anneal is at least three hundred degrees Celsius and not more than four hundred degrees Celsius. Alternatively, the anneal temperature may be at least four hundred degrees Celsius and not more than five hundred degrees Celsius.

In addition to the benefits discussed above, the anneal performed in step 138 may improve the dipole modulation of the Vt of the transistors 292, 294 and 296 due to the use of the reactive metal layer 285. Reactive metals are oxygen getters, allowing such materials to scavenge oxygen atoms out of the underlying oxygen-containing layers during the anneal. The oxygen atoms can then redistribute among the layers, including the work function metal layer 280A/280B/280C. This results in modulation of oxygen related dipoles around the high dielectric constant layer/work function metal layer interface, the high dielectric constant layer/dipole layer interface and the dipole layer/native oxide SiOx interface. A change in the thickness of interfacial oxide layer may also occur. The extent of the modulation is a function of the thickness of work function metal layer 280A/280B/280C, the thickness of the reactive metal layer 285 and the anneal temperature. The result is that the Vt may be further modulated in the tens of millivolt range. This scavenging phenomenon can happen even at medium and/or low temperatures around approximately 500-600 degrees Celsius. Stated differently, the scavenging may occur at temperatures used in the anneal of step 138. Thus, the Vt of the transistors 292, 294 and 296 may be shifted both due to the presence of the dipole layers 262A/262B/262C and the use of the reactive metal layer 285.

Figure 13:
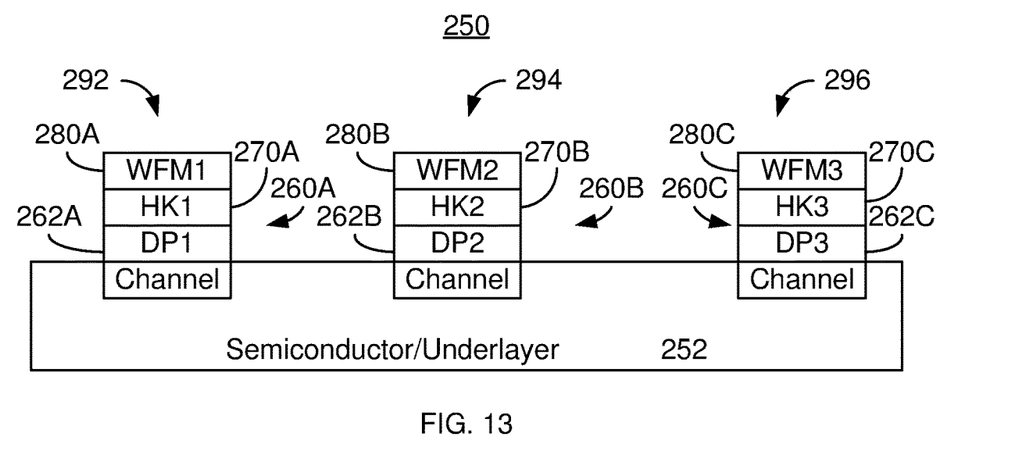
Figure 14:
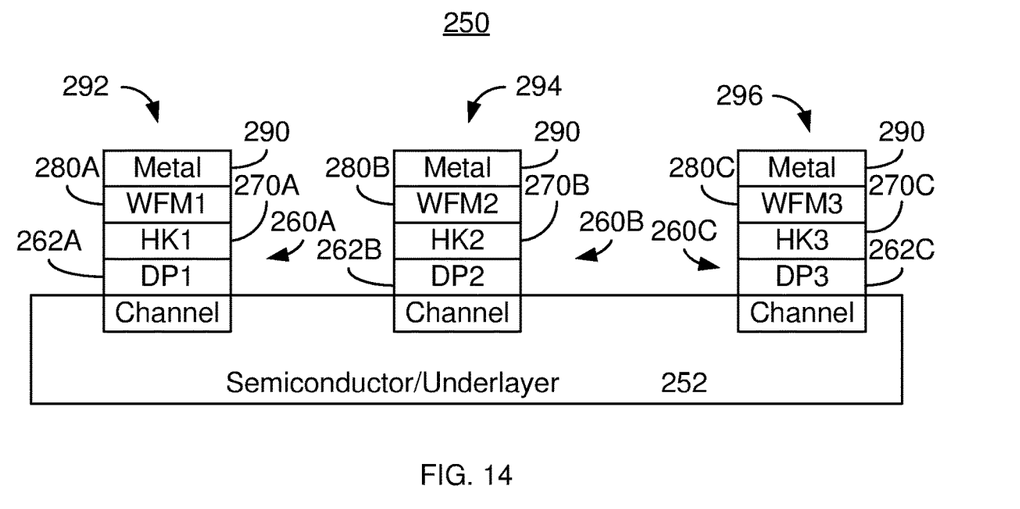

The reactive metal layer 285 is removed, via step 140. FIG. 13 depicts the semiconductor device 250 after removal of the reactive metal layer 285. A contact metal layer is then provided on the work function metal layer, via step 142. In some embodiments, the contact metal layer may be W or Co. However, other metals may be used in other embodiments. FIG. 14 depicts the semiconductor device 250 after step 142 has been performed. Consequently, metal contacts 290 have been provided for each of the devices 292, 294 and 296 being formed. Fabrication of the semiconductor device 250 may then be completed.

The method 120 and semiconductor device 250 may share the benefits of the method 100 and semiconductor device 200. Using the method 120 and the dipole combinations 260A, 260B and 260C, the Vt of the transistors 292, 294 and 296 may be separately tuned to provide a multi-Vt semiconductor device 250. The work function metal 270A/270B/270C sets baseline Vt for each of the transistors 292, 294 and 296. The dipoles formed using the dipole combinations 260A, 260B and 260C may shift the baseline Vt up or down, depending upon the materials used and thickness of the dipole layers 262A/262B/262C. Use of a sacrificial reactive metal layer during the low temperature anneal may provide fine adjustments to the Vt. Thus, a multi-Vt semiconductor device 250 may be provided.

The semiconductor device 250 and method 120 are appropriate for significantly smaller devices. The thickness of the stack used may be dramatically decreased, while still allowing for a significant variation in Vt between transistors. The method 120 may thus be used on smaller devices without concern that the stack merges. Materials such as Al need not be used in the process 120, which may avoid aluminum-related temperature issues. Thus, the method 120 may provide multi-Vt devices 250 that can be scaled to significantly smaller sizes.

The method 120 may also improve performance. The dipole combinations 260A, 260B and 260C may displace the defect bands of the high dielectric constant layers 270A, 270B and 270C. Carriers from the underlying semiconductor interact with the displaced defect bands and may encounter reduced defect traps. Thus, the semiconductor device 200 may have improved mobility and reliability. Consequently, multi-Vt transistors having improved performance may be provided at more extreme scaled nodes.

A method and system for providing multi-Vt semiconductor devices have been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

I claim:

1. A method for providing a gate structure for a plurality of components of a semiconductor device, the method comprising:
   providing a first dipole combination on a first portion of the plurality of components, the first dipole combination including a first dipole layer and a first high dielectric constant layer on the first dipole layer, the providing the first dipole combination further including providing a masking layer on the second portion of the plurality of components;
   depositing a first layer on at least the first portion and the second portion of the plurality of components, a first portion of the first layer on the first portion of the plurality of components forming the first dipole layer;
   depositing an additional layer on the at least the first portion and the second portion of the plurality of components, a first portion of the additional layer on the first portion of the plurality of components forming the first high dielectric constant layer;

removing a second portion of the first layer and a second portion of the additional layer from the second portion of the plurality of components;

providing a second dipole combination on a second portion of the plurality of components, the second dipole combination including a second dipole layer and a second high dielectric constant layer on the second dipole layer, the first dipole combination being different from the second dipole combination;

providing at least one work function metal layer on the first dipole combination and the second dipole combination;

performing a low temperature anneal after the providing the at least one work function metal layer; and providing a contact metal layer on the work function metal layer.

2. The method of claim 1 wherein the providing the at least one work function metal layer further includes:
providing a first work function metal layer on the first dipole combination; and
providing a second work function metal layer on the second dipole combination.

3. The method of claim 2 wherein the providing the first work function metal layer is performed before the second dipole combination is provided.

4. The method of claim 1 wherein the providing the second dipole combination further includes:
providing an additional masking layer on the first dipole combination;
depositing a second layer on at least the first portion and the second portion of the plurality of components, a first portion of the second layer on the second portion of the plurality of components forming the second dipole layer;
depositing a second additional layer on the at least the first portion and the second portion of the plurality of components, a first portion of the second additional layer on the second portion of the plurality of components forming the second high dielectric constant layer;
removing a second portion of the second layer and a second portion of the second additional layer from the first portion of the plurality of components.

5. The method of claim 1 wherein the first dipole combination has a first thickness and the second dipole combination has a second thickness, the first thickness and the second thickness are each less than two nanometers.

6. The method of claim 5 wherein the at least one work function metal layer is at least one nanometer and not more than three nanometers thick.

7. The method of claim 1 wherein the first dipole layer, the second dipole layer and the third dipole layer are each selected from $Lu_2O_3$, $LuSiOx$, $Y_2O_3$, $YSiOx$, $La_2O_3$, $LaSiOx$, $BaO$, $BaSiOx$, $SrO$, $SrSiOx$, $Al_2O_3$, $AlSiOx$, $TiO_2$, $TiSiOx$, $HfO_2$, $HfSiOx$, $ZrO_2$, $ZrSiOx$, $Ta_2O_5$, $TaSiOx$, $ScO$, $ScSiOx$, $MgO$, and $MgSiOx$ and wherein the first high dielectric constant layer, the second high dielectric constant layer and the third dielectric constant layer are selected from $HfO_2$, $ZrO_2$, $HfSiOx$, $HfZrOx$ and $ZrALOx$.

8. The method of claim 1 wherein the low temperature anneal has an anneal temperature of not more than six hundred degrees Celsius.

9. The method of claim 8 wherein the anneal temperature is at least three hundred degrees Celsius and not more than four hundred degrees Celsius.

10. The method of claim 1 wherein the high dielectric constant layer has a dielectric constant greater than a silicon dioxide dielectric constant.

11. The method of claim 1 wherein the at least one work function metal layer includes at least one of TiN, TaN, TiSiN, TiTaN and TiTaSiN.

12. A method for providing a gate structure for a plurality of components of a semiconductor device, the method comprising:
providing a first dipole combination on a first portion of the plurality of components, the first dipole combination including a first dipole layer and a first high dielectric constant layer on the first dipole layer;
providing a second dipole combination on a second portion of the plurality of components, the second dipole combination including a second dipole layer and a second high dielectric constant layer on the second dipole layer, the first dipole combination being different from the second dipole combination;
providing a third dipole combination on a third portion of the plurality of components, the third dipole combination including a third dipole layer and a third high dielectric constant layer on the second dipole layer, the first dipole combination being different from the third dipole combination, the second dipole combination being different from the third dipole combination
providing at least one work function metal layer on the first dipole combination and the second dipole combination;
performing a low temperature anneal after the providing the at least one work function metal layer; and
providing a contact metal layer on the work function metal layer.

13. A method for providing a gate structure for a plurality of components of a semiconductor device, the method comprising:
providing a first dipole combination on a first portion of the plurality of components, the first dipole combination including a first dipole layer and a first high dielectric constant layer on the first dipole layer;
providing a second dipole combination on a second portion of the plurality of components, the second dipole combination including a second dipole layer and a second high dielectric constant layer on the second dipole layer, the first dipole combination being different from the second dipole combination;
providing at least one work function metal layer on the first dipole combination and the second dipole combination;
providing a reactive metal layer on the at least one work function metal layer for at least some of the plurality of components;
performing a low temperature anneal after the providing the at least one work function metal layer and after the providing the reactive metal layer;
removing the reactive metal layer after the performing the low temperature anneal; and
providing a contact metal layer on the work function metal layer after the performing the low temperature anneal and after the removing the reactive metal layer.

14. The method of claim 13 wherein the reactive metal layer includes at least one of Si, Ti, Zr, Hf and La and has a reactive metal layer thickness of not more than four nanometers.

15. A method for providing a plurality of transistors on a semiconductor device, the method comprising:
providing a source and a drain for each of the plurality of transistors, a channel for each of the plurality of transistors, being between the source and the drain;

providing a gate structure on the channel for each of the plurality of transistors, the step of providing the gate structure comprising providing a first dipole combination on a first portion of the plurality of transistors, the first dipole combination including a first dipole layer and a first high dielectric constant layer on the first dipole layer, the first dipole combination residing on an interfacial oxide layer;

providing a second dipole combination on a second portion of the plurality of transistors, the second dipole combination including a second dipole layer and a second high dielectric constant layer on the second dipole layer, the first dipole combination being different from the second dipole combination;

providing a third dipole combination on a third portion of the plurality of components, the third dipole combination including a third dipole layer and a third high dielectric constant layer on the second dipole layer, the first dipole combination being different from the third dipole combination, the second dipole combination being different from the third dipole combination, the first dipole layer, the second dipole layer and the third dipole layer being selected from $Lu_2O_3$, LuSiOx, $Y_2O_3$, YSiOx, $La_2O_3$, LaSiOx, BaO, BaSiOx, SrO, SrSiOx, $Al_2O_3$, AlSiOx, $TiO_2$, TiSiOx, $HfO_2$, HfSiOx, $ZrO_2$, ZrSiOx, $Ta_2O_5$, TaSiOx, ScO, ScSiOx, MgO, and MgSiOx, the first high dielectric constant layer, the second high dielectric constant layer and the third dielectric constant layer being selected from $HfO_2$, $ZrO_2$, HfSiOx, HfZrOx and ZrALOx, each of the first dipole combination, the second dipole combination and the third dipole combination being not thicker than two nanometers and not thinner than one nanometer;

providing at least one work function metal layer on the first dipole combination and the second dipole combination, the at least one work function metal layer including at least one of TiN, TaN, TiSiN, TiTaN and TiTaSiN, the at least one work function metal layer being no thicker than three nanometers;

providing a reactive metal layer on at least a portion of the work function metal layer, the reactive metal layer including at least one of Si, Ti, Zr, Hf and La;

performing a low temperature anneal after the step of providing the reactive metal layer, the low temperature anneal having an anneal temperature of at least two hundred degrees Celsius and not more than six hundred degrees Celsius;

removing the reactive metal layer after the step low temperature anneal; and providing a contact metal layer on the work function metal layer.

* * * * *